United States Patent
Kamgaing et al.

(10) Patent No.: US 10,453,804 B2
(45) Date of Patent: Oct. 22, 2019

(54) RADIO DIE PACKAGE WITH BACKSIDE CONDUCTIVE PLATE

(71) Applicant: INTEL CORPORATION, Santa Clara, CA (US)

(72) Inventors: Telesphor Kamgaing, Chandler, AZ (US); Thorsten Meyer, Regensburg (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/909,939

(22) PCT Filed: Mar. 19, 2015

(86) PCT No.: PCT/US2015/021569
§ 371 (c)(1),
(2) Date: Feb. 3, 2016

(87) PCT Pub. No.: WO2016/148726
PCT Pub. Date: Sep. 22, 2016

(65) Prior Publication Data
US 2017/0062357 A1    Mar. 2, 2017

(51) Int. Cl.
*H01L 23/373* (2006.01)
*H01L 23/498* (2006.01)
(Continued)

(52) U.S. Cl.
CPC .......... *H01L 23/562* (2013.01); *H01L 21/485* (2013.01); *H01L 21/4853* (2013.01);
(Continued)

(58) Field of Classification Search
None
See application file for complete search history.

(56) References Cited

U.S. PATENT DOCUMENTS 6,495,914 B1 * 12/2002 Sekine ............... H01L 23/5389
257/723
2003/0209804 A1 * 11/2003 Knapp ............... H01L 23/3107
257/734
(Continued)

FOREIGN PATENT DOCUMENTS

TW          201510740          1/2015

OTHER PUBLICATIONS

Written Opinion of the International Searching Authority for International Application No. PCT/US2015/021569, dated Dec. 18, 2015, 15 pages.
(Continued)

*Primary Examiner* — Nishath Yasmeen
(74) *Attorney, Agent, or Firm* — Schwabe, Williamson & Wyatt, P.C.

(57) ABSTRACT

A package is described for a radio frequency die that has a backside conductive plate. One example includes a conductive plate, a semiconductor die having a front side and a back side, the back side being attached to the plate, a radio frequency component attached to the plate, a dielectric filled cavity in the plate adjacent to the radio frequency component, and a redistribution layer attached to the front side of the die for external connection.

15 Claims, 5 Drawing Sheets

(51) Int. Cl.
  *H01L 23/552* (2006.01)
  *H01L 23/00* (2006.01)
  *H01L 23/36* (2006.01)
  *H01L 23/66* (2006.01)
  *H01L 25/10* (2006.01)
  *H01L 21/48* (2006.01)
  *H01L 21/56* (2006.01)
  *H01L 25/065* (2006.01)
  *H01Q 1/22* (2006.01)
  *H01Q 1/24* (2006.01)
  *H01Q 1/38* (2006.01)
  *H01L 23/538* (2006.01)

(52) U.S. Cl.
  CPC ........ *H01L 21/4882* (2013.01); *H01L 21/565* (2013.01); *H01L 23/36* (2013.01); *H01L 23/373* (2013.01); *H01L 23/552* (2013.01); *H01L 23/66* (2013.01); *H01L 24/02* (2013.01); *H01L 24/13* (2013.01); *H01L 24/19* (2013.01); *H01L 24/24* (2013.01); *H01L 24/82* (2013.01); *H01L 25/0657* (2013.01); *H01L 25/105* (2013.01); *H01Q 1/2283* (2013.01); *H01Q 1/241* (2013.01); *H01Q 1/38* (2013.01); *H01L 23/49816* (2013.01); *H01L 23/5389* (2013.01); *H01L 2223/6616* (2013.01); *H01L 2223/6672* (2013.01); *H01L 2223/6677* (2013.01); *H01L 2224/02372* (2013.01); *H01L 2224/02379* (2013.01); *H01L 2224/04105* (2013.01); *H01L 2224/12105* (2013.01); *H01L 2224/13024* (2013.01); *H01L 2224/16235* (2013.01); *H01L 2224/24137* (2013.01); *H01L 2224/24195* (2013.01); *H01L 2224/24245* (2013.01); *H01L 2224/32225* (2013.01); *H01L 2224/32245* (2013.01); *H01L 2224/73267* (2013.01); *H01L 2224/82047* (2013.01); *H01L 2224/83191* (2013.01); *H01L 2224/83192* (2013.01); *H01L 2224/83193* (2013.01); *H01L 2224/92244* (2013.01); *H01L 2225/06513* (2013.01); *H01L 2225/06537* (2013.01); *H01L 2225/06548* (2013.01); *H01L 2225/06555* (2013.01); *H01L 2225/06582* (2013.01); *H01L 2225/06589* (2013.01); *H01L 2225/1035* (2013.01); *H01L 2225/1058* (2013.01); *H01L 2225/1094* (2013.01); *H01L 2924/10253* (2013.01); *H01L 2924/1421* (2013.01); *H01L 2924/1434* (2013.01); *H01L 2924/15311* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3511* (2013.01)

(56) References Cited

U.S. PATENT DOCUMENTS

| | | | |
|---|---|---|---|
| 2007/0001287 A1 | 1/2007 | Bosco et al. | |
| 2007/0284704 A1 | 12/2007 | Leal | |
| 2008/0157294 A1 | 7/2008 | Zeng et al. | |
| 2009/0026619 A1 | 1/2009 | Zeng et al. | |
| 2009/0039457 A1* | 2/2009 | Xie | H01L 21/84 257/508 |
| 2009/0091904 A1 | 4/2009 | Hatanaka et al. | |
| 2010/0116632 A1 | 5/2010 | Smith et al. | |
| 2011/0089529 A1* | 4/2011 | Fowlkes | H01L 23/3677 257/528 |
| 2011/0215449 A1 | 9/2011 | Camacho | |
| 2011/0298109 A1 | 12/2011 | Pagaila | |
| 2011/0316117 A1 | 12/2011 | Kripesh et al. | |
| 2012/0049342 A1* | 3/2012 | Rathburn | H01L 21/6836 257/734 |
| 2012/0086109 A1* | 4/2012 | Kim | H01L 21/561 257/659 |
| 2014/0084391 A1 | 3/2014 | Lenive et al. | |
| 2014/0084415 A1 | 3/2014 | Lin et al. | |
| 2014/0159212 A1 | 6/2014 | Hung et al. | |
| 2014/0239464 A1* | 8/2014 | Chung | H01L 23/60 257/659 |
| 2014/0252647 A1* | 9/2014 | Huang | H01L 23/49827 257/774 |
| 2015/0021754 A1 | 1/2015 | Lin et al. | |

OTHER PUBLICATIONS

International Preliminary Report on Patentability for International Patent Application No. PCT/US2015/021569 dated Sep. 28, 2017, 11 pages.
Search Report for European Patent Application No. 15885744.1, dated Sep. 24, 2018, 10 pages.
Office Action from Taiwan Patent Application No. 105101513, dated May 26, 2017, 8 pages.
Notice of Allowance from Taiwan Patent Application No. 105101513, dated Dec. 21, 2017, 3 pages.

* cited by examiner

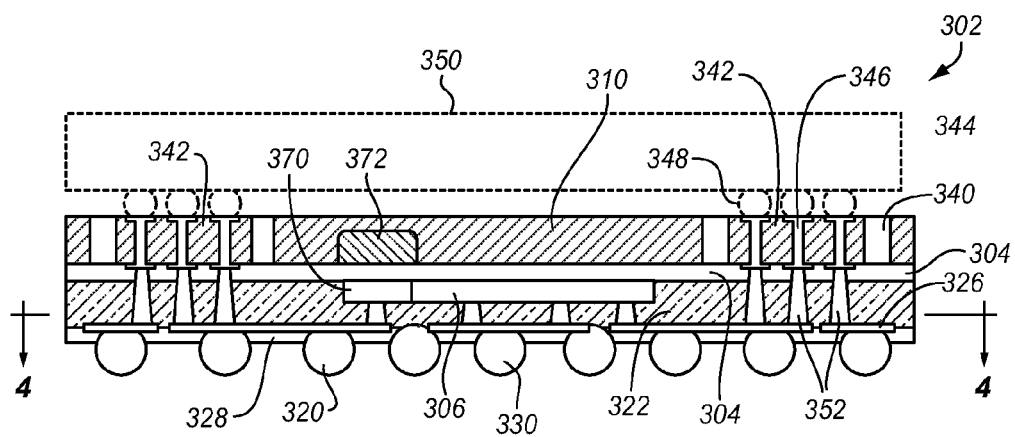
FIG. 3
FIG. 4
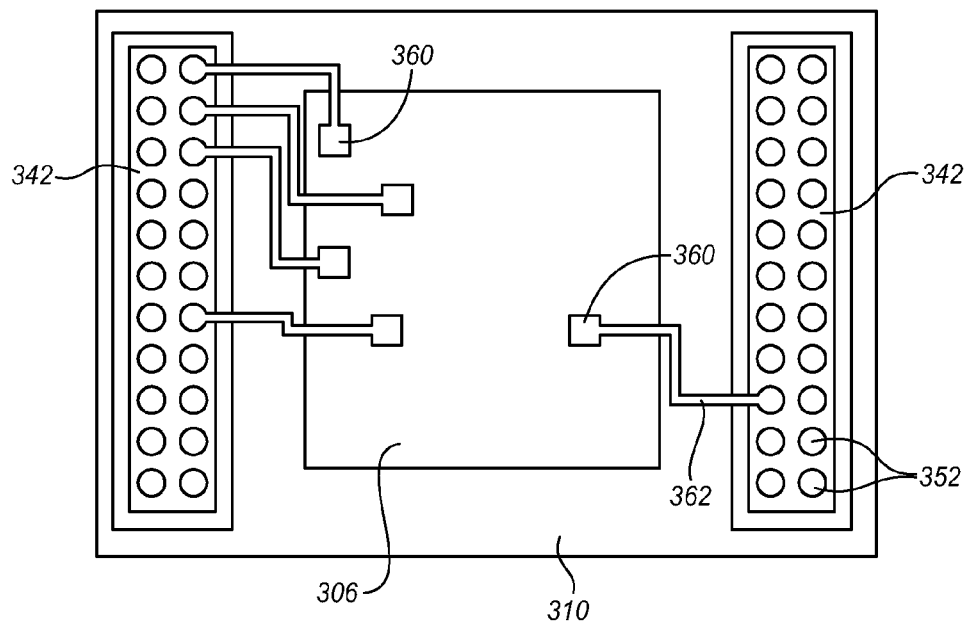

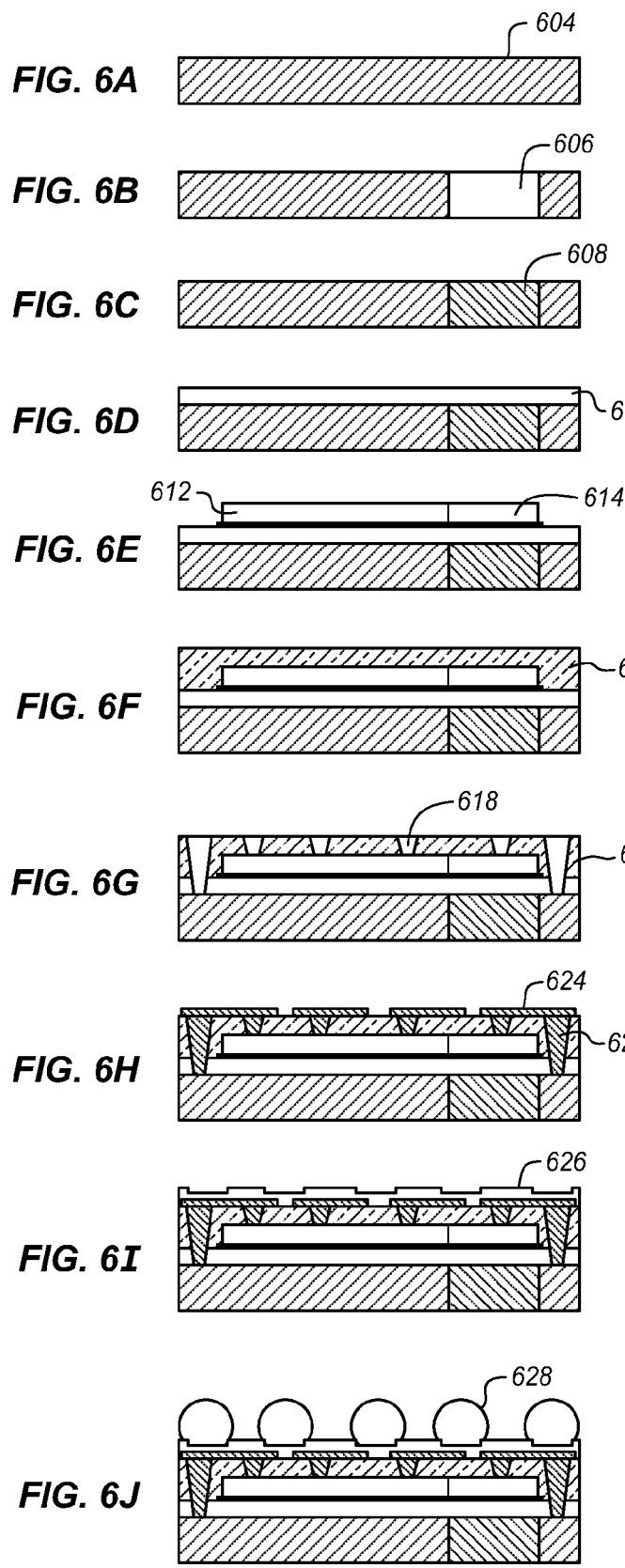

RADIO DIE PACKAGE WITH BACKSIDE CONDUCTIVE PLATE

CROSS-REFERENCE TO RELATED APPLICATION

This patent application is a U.S. National Phase Application under 35 U.S.C. § 371 of International Application No. PCT/US2015/021569, filed Mar. 19, 2015, entitled RADIO DIE PACKAGE WITH BACKSIDE CONDUCTIVE PLATE.

FIELD

The present disclosure relates to packaging semiconductor dies and in particular to a package with a backside metallization.

BACKGROUND

Semiconductor dies that contain radio circuits such as baseband and RF (Radio Frequency) ICs (Integrated Circuits) are difficult to package and integrate into very small electronic devices because the radio circuits generate heat and electromagnetic waves. Radio circuit dies are packaged in QFN (Quad Flat Non Lead) packages and other packages that have a solid metal plate to cover the back side of the die (backside metallization). The backside metallization serves as shield (e.g. an EMI (Electro-Magnetic Interference) shield) to protect other fast switching devices. The backside metallization also may serve as a heat sink for radio circuit dies that require high power dissipation such as PMICs (Power Management Integrated Circuits) and PAs (Power Amplifiers).

With the push for ever more miniaturization, dies and their packages are made ever thinner Currently dies may be thinned to a height of 50 µm or less. At those thicknesses, the circuitry of the semiconductor die is close enough to the backside metallization to be affected by it. A solid metal plate on the backside of the die becomes detrimental to any RF circuits such as PAs, LNAs (Low Noise Amplifier), VCOs (Voltage Controlled Oscillator), mixers, etc. . . . . The large metal plate decreases the inductance and the quality factor (Q) of any inductors or transformers on the die. These components are commonly used in radio circuits. The reduced inductance and Q may lead to frequency shifts, increased noise, and reduced output power. Without the backside metallization, the die may warp, crack, overheat, or suffer other problems.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 3 is side cross-sectional view diagram of a stacked die package with a dielectric cavity and via bars according to an embodiment.

FIG. 4 is a bottom cross-sectional view along line 4-4 of the package of FIG. 3 according to an embodiment.

FIGS. 6A to 6J are cross-sectional side views of a sequence of fabrication stages for producing an alternative package with a dielectric cavity according to an embodiment.

DETAILED DESCRIPTION

A fan-out WLB (Wafer Level Ball Grid Array) package has a die covered with mold compound. The mold compound protects the die without deteriorating the RF (Radio Frequency) performance of thin dies. However, the mold compound does not provide a strong backing for preventing die warpage and may not conduct heat well enough for dies that require significant thermal dissipation. Accordingly, a thicker die, such as 50 µm or more, is normally used in a WLB package for reliability reasons.

A fan-out WLB package may be modified for a thinned die (e.g. 30-50 µm). The die may be mounted on a special metal carrier using a single layer or multilayer die attach film. The metal carrier may be processed to have a desired CTE (Coefficient of Thermal Expansion). The metal carrier provides improved reliability and reduced warpage in comparison to molded die packages. Such a modified package works well for PMIC dies and other dies that do not include on-chip inductive passive components.

A fan-out WLB package with a backside metal carrier improves reliability and reduces package costs for PMICs and for digital circuits. The backside metal carrier affects the performance of inductive components that are near the metal carrier. More specifically, image current generated in the plane of the metal carrier flows in the opposite direction from the main current in the inductive component and in this way contributes to the decrease in inductance. A cavity, blind, or through cavity may be formed in the metal layer and then filled with a dielectric. This extends the separation between the metal ground layer and the RF circuits, improving the electrical performance of the inductive components. The benefits of improved reliability and reduced warpage are retained. As a result, the die and the package may be made much thinner.

The backside metal carrier may also be used to improve the thermal performance of the die and the package overall. In the case of a 3D and compact system package, the backside metal carrier may be used as a shield and combined with ground vias to provide EMI isolation.

The metallic carrier allows the cost of the package to be significantly reduced and allows the package to be made much thinner. The die thickness may be reduced to 20 µm or less and the backside metal thickness may be reduced to 30 µm or less. Such very thin packages may be bendable. This may be useful for wearable computing devices or other small portable devices.

Figure 1:
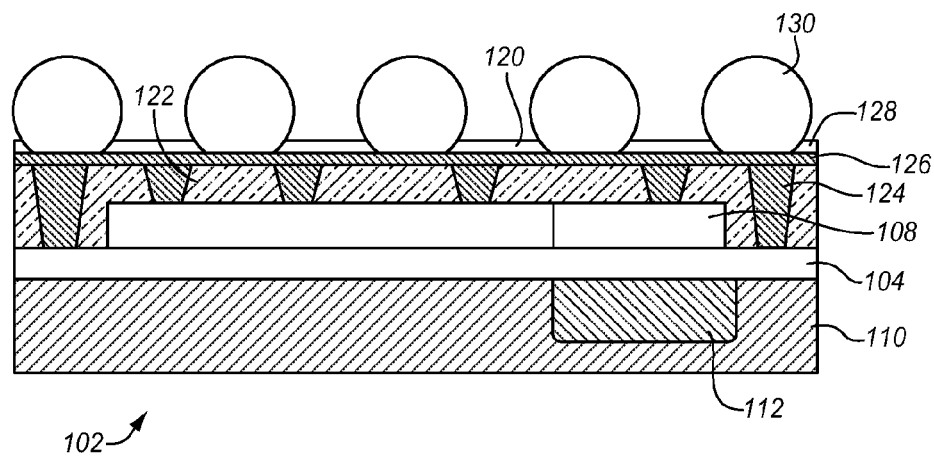
FIG. 1 is side cross-sectional view diagram of a package with a dielectric cavity according to an embodiment.

FIG. 1 is a cross-sectional side view of a package 102 with a backside metallization layer 110. It includes an ultra-thin SOC (System on a Chip) die 106 with one or more integrated RF circuits in an RF section 108. The die is mounted on top of a metallic carrier (backside metal) 110 using a multilayer die attach film (DAF) 104. The DAF may be single layer or multilayer. As shown, the backside of the die is facing the backside metal.

The backside layer 110 is selected to provide structural strength to the overall package and a CTE that is similar to that of the die. In addition, for shielding, the backside layer should be electrically conductive and for cooling, the backside layer should be thermally conductive. As a result, the backside layer may be in the form of a conductive plate. Many metals provide an easily worked, low cost material for the conductive plate. Accordingly, the backside layer may be referred to as a backside metallization or as a metal plate. However the invention is not so limited. Any material with a high young's modulus for stiffness and warpage prevention as well as a suitable CTE may be used. A silicon package substrate is not well suited for this use. However, polymer plates, and ceramics (e.g. Low Temperature Co-Fired Ceramics) have CTEs in a suitable range, which are close to the CTE of the die substrate. If the polymer or ceramic is not conductive, then a conductive layer (not shown) may be added to the backside layer so that the backside layer is a conductive plate.

The front side of the die has a pattern of die pads that are covered in a dielectric 122. A pattern of vias 120 connects the die pads to a fan-out layer or redistribution layer 126. The redistribution layer is covered with a solder stop layer 128 and connected to solder balls 130 or another connection array to connect the die to external components. Additional vias 124 may be formed through the dielectric to connect to the backside metallization 110 for isolation, shielding purposes etc. The die pads or pads may be externally connected in any of a variety of different ways. In some embodiments, the package is formed using ePLB (embedded Panel Level Ball Grid Array) or eWLB (embedded Wafer Level Ball Grid Array) processes.

A blind or through cavity 112 filled with non-conductive material such as dielectric is formed in the backside metallization right below the RF section 108 of the die. The non-conductive material (dielectric) layer may be selected to have both a low loss tangent and also a low dielectric constant. The layer may be made of a variety of different materials which may include epoxy, polyimide, liquid crystal polymer (LCP) or other suitable materials, including many of the dielectric materials already common in packaging.

The on-chip circuits, such as inductors, transformers, capacitors, resistors, amplifiers, and other components of the RF section 108 are typically formed on the front side of the die. As a result, they are separated from the backside metal by the backside (bulk silicon) thickness of the die. The cavity depth and die thickness together define the separation between the on-chip inductors and the metal plane. To obtain stability similar to that of QFN packages, this combined thickness may be larger than 150 μm. Other implementations may be designed to meet other performance criteria.

A typical radio frequency transceiver, which can be a standalone chip or part of an SoC die as shown in FIG. 1 may have several inductors and transformers with the size varying from about 200 μm×200 μm to about 1 mm×1 mm. The dielectric cavity 112 may be formed to isolate individual inductive components. In such a case the cavity may be 50 μm or more wider than the specific targeted inductive component. Alternatively, the dielectric-filled cavity 112 may be targeted to cover the whole RF section 108 of the SoC die. In this case the size of the cavity may depend upon the size of the RF section. This typically varies from about 0.5 mm×0.5 mm to about 3 mm×3 mm. However, the invention is not so limited.

Figure 2:
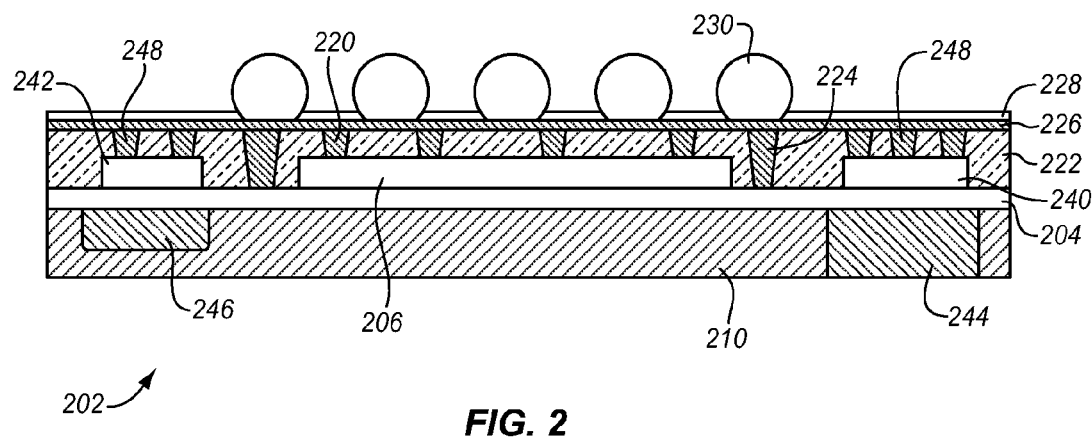
FIG. 2 is side cross-sectional view diagram of an alternative package with two dielectric cavities according to an embodiment.

FIG. 2 shows a similar package 202 with a semiconductor die 206. The back side of the die is attached to a conductive plate 210, which may be made of metal, ceramic, polymer, or another material, using a die attach film 204 and the front side of the die has an array of pads coupled through vias 220 to a fan-out layer 226. The fan-out layer is covered in a solder resist layer 228 with connection pads for a solder ball array 230, such as a BGA (Ball Grid Array). The die is covered by a dielectric 222 between the die attach film and the fan-out layer.

The die may include RF sections and corresponding adjacent dielectric filled cavities in the metal plate 210 as in FIG. 1. RF sections may be placed at any desired position on the front side of the die depending on the particular implementation. Although no RF sections are shown in this example, they may be formed in the same way as in the example of FIG. 1.

For additional functionality, this package 202 includes a discrete RFIC (Radio Frequency Integrated Circuit) die 240 and a discrete IPD (Integrated Passive Device) die 242. The IPD may contain a variety of different passive components, such as inductors, capacitors, resistors, and transformers. There may be one or more of these dies in any of a variety of different positions. The dies have circuitry on their front sides which are facing the fan-out layer and vias 248 through the dielectric to connect pads on the dies to the fan-out layer. From the fan-out layer, these dies may be coupled to the main die 206, to each other, or to other external components. Additional vias 224 couple the metal plate 210 through the dielectric to or through the fan-out layer to a ground or other stable voltage.

In the example of FIG. 1, the single die 106 may be a complete or partial system encapsulated between the dielectric and the metal plate. There may be additional dies, depending on the intended functionality of the system. FIG. 2 shows some additional dies. These may be used to complement the function of the main die to provide a complete or partial system in a package. Alternatively, the RFIC or IPD may be used to support RF functions or I/O (Input/Output) functions of the main die.

FIG. 2 is a cross-sectional side view diagram of an example embodiment for a SiP (System-in-a-Package). An ultra-thin digital die 206 such as a baseband die, an application processor, a PMIC (Power Management Integrated Circuit) or a SoC (System on a Chip) is mounted on a metallic carrier 210. Radio frequency components including an RFIC, power amplifier, or IPDs are fully or partially mounted above corresponding dielectric-filled cavities. The cavity filler is engineered to have specific electrical or thermo-mechanical properties to suit the particular dies and their intended uses. Together a 2D SiP/wireless module is formed in which the radio frequency dies are placed above dielectric-filled blind or through cavities.

To enhance the performance of the additional dies in FIG. 2, a dielectric area is formed in the metal plate next to each die. There are two different types of dielectric areas. Each one may be used on either one or both of the die types. The different types are shown as examples. In one example, the same type of cavity 112 as in FIG. 1 is used. As shown, adjacent to the IPD die 242, a cavity is formed in the metal plate 210. This cavity is then filled with dielectric material to form a dielectric cavity 246. Such a cavity may be used for either or both dies.

In the other example, a hole is drilled, etched, or machined through the metal plate in the location that will be adjacent to the RFIC. The hole is then filled with dielectric to form a through cavity 244 of dielectric. While the cavity 244 is shown as extending all the way through the metal plate in this cross-sectional view, the die and the cavity are typically not as wide as the metal plate so that the cavity is rectangular as viewed from the top or bottom. Dies are often rectangular, however, the cavities may be made in any shape that is suited to the RF or passives section of an adjacent die.

The cavities may be sized based on the entire size of the die or based only on the locations of the components which are to be isolated from the metal plate. As an example, if the IPD include transformers in one area and resistors in another area with no transformers, then the cavity may be formed in a position and size corresponding only to the transformers. Alternatively, the cavity may be sized to correspond to the entire die, as shown.

The size of the cavity may be adapted based on the die that is to be attached to the plate. As an example, the cavity size may vary from about 200 μm square to about 3 mm square for a large SoC die. For a thick backside metallization plate (e.g. 300 μm), the cavity may have a depth of about 150 μm or less. For a thin backside metallization (e.g. 10-100 μm), there may not be enough space to provide sufficient isolation. A through cavity 244 may be used to provide sufficient distance between the die and the metal.

FIG. 3 is a side cross-sectional view diagram of a stacked package die 302 in which a through cavity 340 is used to enable the use of a thin-die package in a 3-D stack. In this case via bars 342 are mounted inside the cavity to enable the stacking of other dies or packages 350 such as a memory or microprocessors. The backside metallization layer inherently provides a metallic shield 310 for the package and provides EMI isolation for the stacked die. In this way it may also remove any need for external shielding. A 3D SiP may be constructed in this way with full electrical isolation between the bottom die 306 and the stacked package or die 350.

Considering the package in more detail, a semiconductor die 306, such as a processor, a SoC or any other type of semiconductor die is attached on its back side to a metal plate 310 or other suitable backside layer material using a die attach film 304. The die may have RF or passive device sections and these sections may be isolated from the metal plate using dielectric filled cavities as in FIG. 1. The front side of the die is covered in a dielectric 322. Vias are formed through the dielectric to couple the front side of the die to a fan-out or redistribution layer 326. The redistribution layer has a solder stop layer 328 and a ball grid array 330 or other external connection structure.

In contrast to FIGS. 1 and 2, the package 302 of FIG. 3 is configured to support a second die or package over the back side of the die and over the metal plate of the package. Large holes are drilled, machined, or etched through the metal plate in any desired location. As shown, there is a rectangular opening on each of two opposite sides of the die. The through holes are spaced apart from the die laterally so that they can connect to the redistribution layer without affecting the die. The holes are each filled with a pre-formed via bar 342 which are held in place with a dielectric adhesive material 340. The via bars 342 have a pattern of vias 352 formed in a dielectric and sized to be attached to the large through holes. While bars are discussed herein, any other configuration of vias may be used instead. Vias similar to those of the via bars may alternatively be formed in the metal plate individually rather than pre-formed and attached.

The vias of the via bar have a corresponding array of pads on one side opposite the die to connect to solder balls 348 that connect to a second package or die 350. The vias also connect through the die attach film 304 to vias through the dielectric 322 that covers the first die. These vias allow for a connection to external components through the ball grid array 330 and also allow for connections through the fan-out layer 326 and the first set of vias 320 to the first chip.

As an example, the top package may be a memory package over the first die. The first die may be a processor. The memory package may connect using the via bars to external power and also using the via bars and the fan-out layer to the processor. The package may be constructed with different memory packages to suit different needs and budgets. The memory package is shielded from the processor die by the metal plate.

The first die 306, as in FIG. 1 may include one or more RF sections 370 and the backside metallization 310 may include a blind or through dielectric filled cavity 372 as in the example of FIG. 1. In addition, there may be additional RFIC or IPD dies (not shown) attached to the back side metallization and corresponding additional cavities as shown in FIG. 2.

FIG. 4 is a bottom cross-sectional view of the package of FIG. 3 from the bottom through the line 4-4 with the dielectric over the metal plate removed and the die attach film being transparent. The central main die 306 is shown attached to the metal plate 310 with a die attach film (not shown). Via bars 342 are formed on two opposite sides of the die 306. The via bars have a large number of through vias 352 for external connection or to connect to the die or both.

For explanation purposes, a few connection pads 360 are connected through a trace 362 in the fan-out layer 326 to a corresponding via 352. This via will provide a connection through the dielectric 322 (not shown) through the via bar 342 in the metal plate 310 to the top package or die 350. While only a few traces are shown connecting to only a few connection pads. There may be many more. The connection pads on the die may be clustered together or distributed as shown across the die. The traces are illustrated to show how the via bars connect to the die and are not a proper part of the bottom cross-section through line 4-4.

Figure 5A:
FIGS. 5A to 5J are cross-sectional side views of a sequence of fabrication stages for producing a package with a dielectric cavity according to an embodiment.
Figure 5B:

FIGS. 5A-5J show a sequence of fabrication stages for producing a package with a cavity for an RF or passives section as described in the context of FIG. 1. The illustrated process uses a blind cavity. FIG. 5A starts with a metal plate 504. Any metal that provides a suitable EMI shield may be used, such as copper, aluminum, titanium and alloys thereof. Alternatively, the plate may be formed of a polymer or a ceramic that provides sufficient EMI shielding. In FIG. 5B one or more blind cavities 506 are formed in the plate by drilling etching, stamping or milling. Alternatively, for ceramic or polymer materials, the cavity may be formed as a part of molding or casting the plate.

Figure 5C:
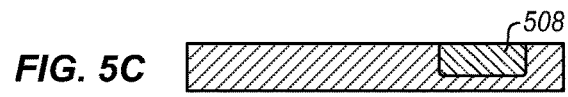
Figure 5D:
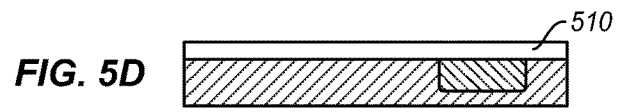

In FIG. 5C the cavity is filled with a dielectric material 508. The dielectric may be applied in a variety of different ways including by printing, spinning, lamination, or dispensing. In FIG. 5D a die attach film 510 is applied over the open side of the blind cavity. The die attach film may be made of any of a variety of different materials. The die attach film may also be selected of a material that is suitable for a passivation layer for the die. Alternatively, a passivation layer may be applied to the plate first, followed by an adhesive as a die attach layer. The passivation layer is an optional layer that is not shown in some of the other drawing figures but may be used in any of the described implementations.

Figure 5E:
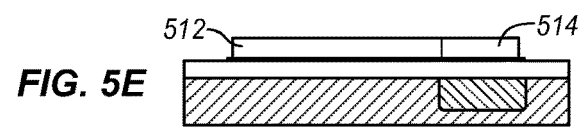

In FIG. 5E a semiconductor die 512 that includes one or more RF or passive device sections 514 is attached to the plate 504 using the die attach film. The back side of the die is attached to the plate so that the front side connections are exposed on the side opposite the plate. The die attach film may be applied over the passivation layer, over the die or both. The die is attached to the plate so that the RF section 514 is directly over the dielectric filled cavity. While only one die is shown, multiple dies of different types may be attached as shown for example in FIG. 2, to support the main die or to provide additional functionality for SiP and for other applications.

The die, as shown, is thinner than the plate. The thickness of the die is determined by the desired thickness of the overall package. The thickness of the plate is determined by the desired strength of the plate and its EMI shielding properties. The plate may be used to physically support and reinforce the rigidity and strength of the die so that the die may be thinned more than for a package without the plate. For a typical thin package, the die may be thinned so that the plate is two or more times thicker than the die.

Figure 5F:
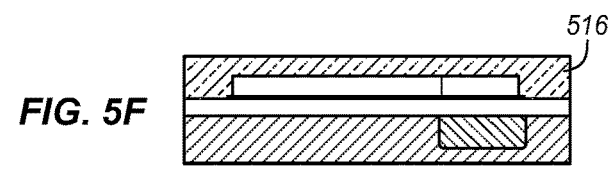

In FIG. 5F a dielectric layer 516 is applied over the front side of the die. The dielectric may be any of a variety of different materials including a molding compound or resin, epoxy, or polymer. The dielectric layer may be laminated over the die in one or more layers or applied in another way. The die is now embedded or encapsulated in the dielectric.

Figure 5G:
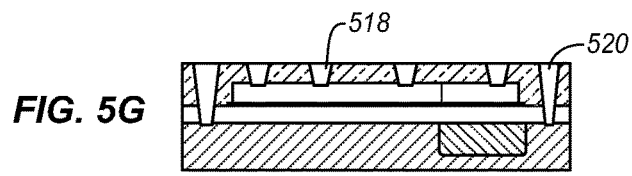

In FIG. 5G vias are drilled through the dielectric by laser, etching, or in other ways. There are two types of vias shown. The first type of via 520 is from the top of the dielectric layer down to the plate. This allows the plate to be charged or grounded for EMI and other purposes. In the example of FIG. 2, such a via allows for a connection to another die or package to be stacked over the first die (underneath the metal plate as shown in FIG. 5G). The second type of via 518 is drilled from the top of the dielectric layer to a connection pad of the die to allow the die to be connected to external components and to other dies in the same package. While only a few vias are shown, there may be hundreds or thousands of vias depending on the type of die and its intended application.

Figure 5H:
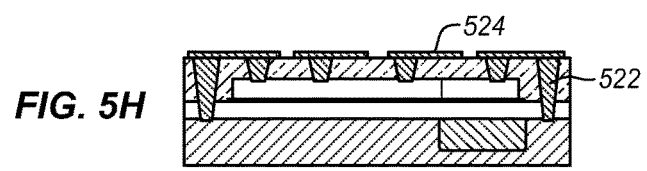

In FIG. 5H, the drilled vias are filled or coated with a conductive material 522, such as copper and a redistribution layer or fan-out layer 524 is formed over the dielectric. The redistribution layer may be formed of conductive traces, such as copper traces, that are patterned by photolithography, printing or using any other desired patterning technology. The redistribution layer allows dies of the package to connect to each other and to external components.

The redistribution layer may also allow connections to be relocated from their positions on the die to a more suitable position for external connection. There may be more than one redistribution layer to provide for more complex distribution of the external connections. In such a case, a second layer of dielectric is applied over the first redistribution layer. Vias are formed in the dielectric and another conductive redistribution pattern is formed over the dielectric and the vias. This layering process may be repeated as desired to suit any particular implementation.

Figure 5I:
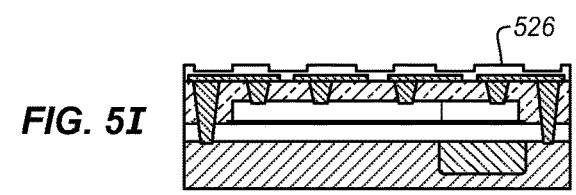
Figure 5J:
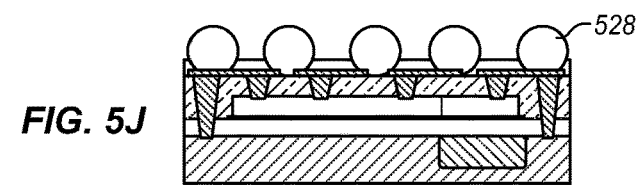

In FIG. 5I a solder stop layer 526 is formed and structured over the top redistribution layer. In FIG. 5J a solder, or a solder paste, or a flux, is applied or patterned over the solder stop layer and solder balls 528 are applied over the solder stop layer. The solder balls allow the die and optionally the plate to be connected to external components. The package of FIG. 5J is finished, however, additional processes may be added. Cooling devices may be attached to the metal plate. Additional dies may be added to the metal opposite the die as shown in FIG. 4 by drilling through the plate to form additional vias. Other additional processes may also be performed. The finished package may be attached to a socket, a circuit board, or a package substrate of a larger package to be packaged with other packages.

FIGS. 6A-6J show a sequence of fabrication stages for producing a package with a through hole or open cavity for an RF section as described in the context of FIG. 2. The illustrated process uses a single open cavity for a single die. The process is similar to that of FIGS. 5A to 5J. However, as with FIGS. 5A to 5J, the operations may be modified to suit different sizes, configurations and numbers of dies. In addition, while only a few features are shown there may be many more cavities vias, layers and other structures to suit different applications. FIG. 6A starts with an EMI shield or a stiffener in the form of a plate 604. In FIG. 6B one or more open cavities 606 are formed in the plate by drilling etching, stamping, milling, molding, casting, etc. As shown, the cavity extends through the plate from top to bottom. Such an open cavity is particularly suitable for a thinner plate where a blind cavity will not be deep enough.

In FIG. 6C the cavity is filled with a dielectric material 608. In FIG. 6D a passivation layer 610 is applied over the open side of the blind cavity. The passivation layer may be applied to the plate first, followed by an adhesive die attach layer. Alternatively, there may be only the die attach layer.

In FIG. 6E one or more semiconductor dies 612 that includes one or more RF or passive device sections 614 is attached to the plate 604 using the die attach film. Alternatively, the RF section may be part of a different die. The back side of the die is attached to the plate. The front side connections are exposed on the side opposite the plate. The die is attached to the plate so that the RF section 614 is directly over the dielectric filled cavity.

In FIG. 6F a dielectric layer 616 is applied over the front side of the die. In FIG. 6G vias are drilled through the dielectric by laser, etching, or in other ways. Some of the vias 620 may attach to the plate, while other vias 618 attach to the die.

In FIG. 6H, the vias are filled or coated with a conductive material 622 and a redistribution layer or fan-out layer 624 is formed over the dielectric. There may be multiple layers of dielectric and patterned redistribution layer, depending on the particular implementation.

In FIG. 6I a solder stop layer 626 is formed over the top redistribution layer. In FIG. 6J the solder balls 628 are applied over the solder stop layer to form a ball grid array. Any other type of conductive connection structure may be formed in order to suit the intended connection for the package. The package may be finished using additional operations and processes as desired for the final end use of the package.

The techniques and structures described herein may be applied to a wide variety of different types and sizes of dies. It is particularly suitable for thin and ultra-thin dies. The backside metallization may be made as thick as 350 μm or more to provide rigidity and strength and protect the die. Alternatively a thin die and plate, such as 50 um or less will allow dies and backside layer to bend. This may be preferred for implementation in wearable computing devices or portable devices.

Both through cavities and blind cavities in the backside metallization help preserve the electrical performance of radio components of a chip. As an example, when a die with an inductor on the front side is thinned from 150 μm to 30 μm and attached to a metallic plate, the inductance decreases by more than 35%. However, when a cavity is created below the inductor, the inductance is fully recovered. A similar decrease is also seen on the quality factor of the inductor. Using a cavity, however, the quality factor of the inductor is improved beyond the value for the thick die. This is because the reduction in silicon thickness from 150 μm to 30 μm contributes to the benefit. Thinning the die eliminates some of the eddy current losses associated with the silicon substrate.

Figure 7:
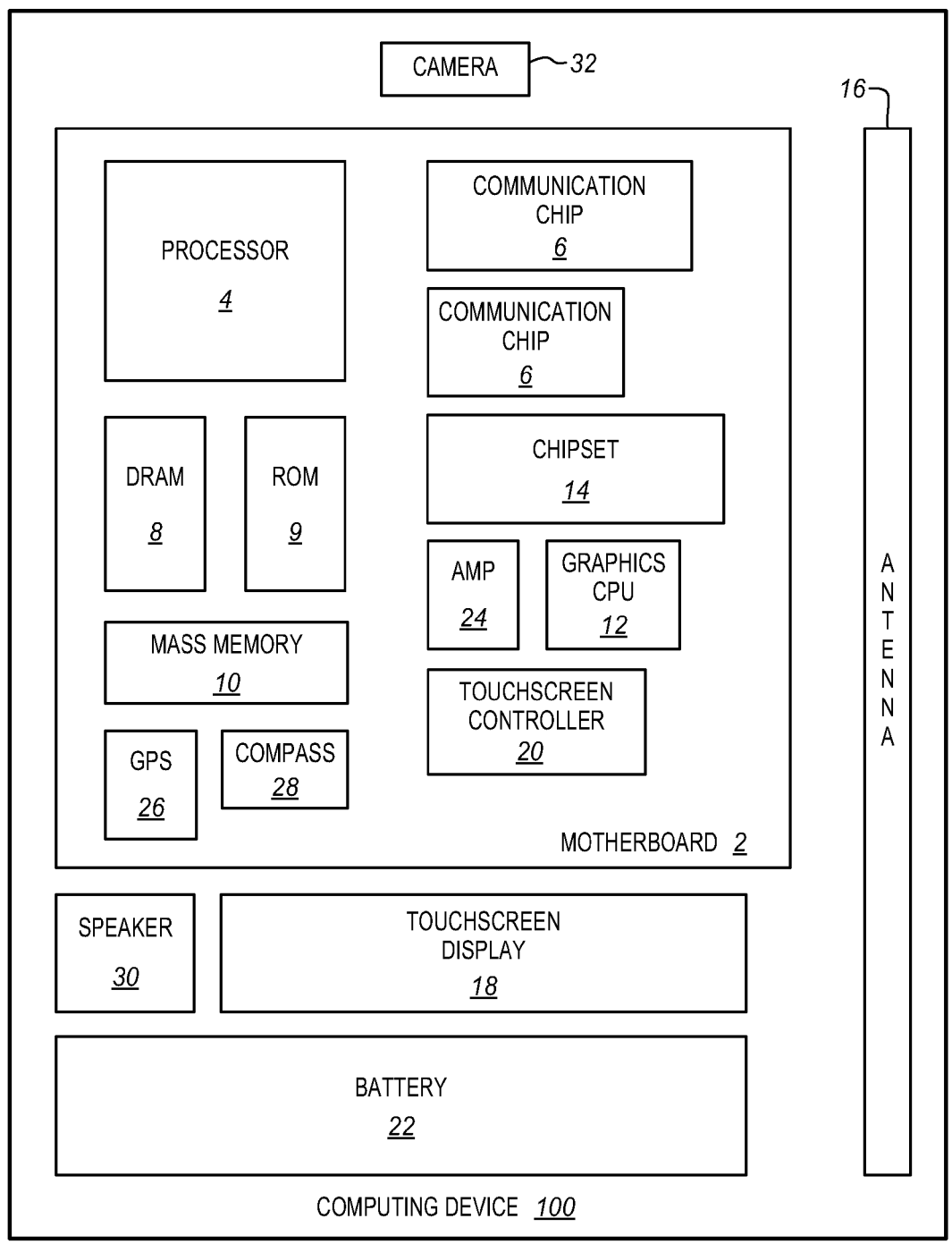
FIG. 7 is a block diagram of a computing device incorporating a tested semiconductor die according to an embodiment.

FIG. 7 illustrates a computing device 11 in accordance with one implementation of the invention. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and other.

The processor 4 of the computing device 11 includes an integrated circuit die packaged within the processor 4. In some implementations of the invention, the integrated circuit die of the processor, memory devices, communication devices, or other components include or are packaged with RF or passive components attached to a plate with a dielectric cavity as described herein. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a semiconductor package that includes a conductive plate, a semiconductor die having a front side and a back side, the back side being attached to the plate, a radio frequency component attached to the plate, a dielectric filled cavity in the plate adjacent to the radio frequency component, and a redistribution layer attached to the front side of the die for external connection.

In further embodiments the plate comprises copper, ceramic, or polymer.

In further embodiments the dielectric comprises epoxy, polyimide, or liquid crystal polymer.

In further embodiments the cavity extends through the plate from a side attached to the die to a side opposite the die.

In further embodiments the radio frequency component is formed on the front side of the die.

In further embodiments the die has a section containing radio frequency circuits including the radio frequency component.

In further embodiments the radio frequency circuits comprise a radio frequency amplifier.

Further embodiments include a second die, the second die also being attached to the plate, and wherein the radio frequency component is formed on the second die.

Further embodiments include a dielectric over the die and the plate between the die and the redistribution layer.

Further embodiments include a second die, a second dielectric filled cavity in the plate spaced apart from the first die and a via bar within the second dielectric cavity, and a connection pad array on the via bar to connect to the second die on a side of the plate opposite the first die.

Further embodiments include a plurality of vias to connect the via bar to the redistribution layer.

Further embodiments include a passivation layer between the die and the plate.

Some embodiments pertain to a method that includes forming a cavity in a plate, attaching a back side of a die to the plate, the die having an RF section and the die being attached so that the RF section is adjacent to the cavity, covering a front side of the die with a dielectric, and forming a redistribution layer over the dielectric for external connection of the front side of the die.

Further embodiments include filling the cavity with a dielectric before attaching the die.

Further embodiments include attaching a second die to the plate and covering the die with a dielectric comprises covering the first and the second die with the dielectric.

Further embodiments include forming vias in the dielectric before forming the redistribution layers, the vias connecting connection pads of the die to the redistribution layer.

In further embodiments forming a cavity comprises forming a cavity through the plate from one side closest to the die to the opposite side.

Further embodiments include forming a second cavity through the plate and spaced apart from the die before attaching the die, filling the second cavity with a dielectric, forming vias through the dielectric of the second cavity, connecting the second cavity vias on one side to the redistribution layer, and connecting the second cavity vias on the opposite side to an additional die.

In further embodiments connecting the second cavity vias on one side comprises forming vias through the dielectric covering the die to connect the second cavity vias to the redistribution layer.

Some embodiments pertain to a computing device that includes a power supply, an antenna, and a package containing a conductive plate, a semiconductor die having a front side and a back side, the back side being attached to the plate, a radio frequency component attached to the plate and coupled to the antenna, a dielectric filled cavity in the plate adjacent to the radio frequency component, and a redistribution layer attached to the front side of the die for external connection to the antenna and the power supply.

In further embodiments the radio frequency circuits comprise a radio frequency amplifier.

Further embodiments include a second die, the second die also being attached to the plate, and wherein the radio frequency component is formed on the second die.

Further embodiments include a dielectric over the die and the plate between the die and the redistribution layer.

In further embodiments the die is a processor, the package further includes a memory die, a second dielectric filled cavity in the plate spaced apart from the processor and a via bar within the second dielectric cavity, and a connection pad array on the via bar to connect to the memory die on a side of the plate opposite the processor and to connect the memory die to the processor through the redistribution layer.

Further embodiments include a plurality of vias to connect the via bar to the redistribution layer.

The invention claimed is:

1. A semiconductor package comprising:
a conductive plate;
a semiconductor die having a front side and a back side, the back side being attached to the conductive plate;
a radio frequency component attached to the conductive plate;
a dielectric filled cavity in the conductive plate, the dielectric filled cavity continuously surrounded by the conductive plate, and the dielectric filled cavity vertically beneath the radio frequency component such that the radio frequency component and the dielectric filled cavity overlap with one another in a plan view, wherein the dielectric filled cavity extends through the conductive plate from a side attached to the semiconductor die to a side opposite the semiconductor die;
a redistribution layer attached to the front side of the semiconductor die for external connection;
a second die;
a second dielectric filled cavity in the conductive plate spaced apart from the semiconductor die and a via bar within the second dielectric filled cavity; and
a connection pad array on the via bar to connect to the second die on a side of the conductive plate opposite the semiconductor die.

2. The package of claim 1, wherein the conductive plate comprises copper, ceramic, or polymer.

3. The package of claim 1, wherein the dielectric comprises epoxy, polyimide, or liquid crystal polymer.

4. The package of claim 1, wherein the radio frequency component is formed on the front side of the semiconductor die.

5. The package of claim 4, wherein the semiconductor die has a section containing radio frequency circuits including the radio frequency component.

6. The package of claim 5, wherein the radio frequency circuits comprise a radio frequency amplifier.

7. The package of claim 1, further comprising a second die, the second die also being attached to the conductive plate, and wherein the radio frequency component is formed on the second die.

8. The package of claim 1, further comprising a second dielectric over the semiconductor die and the conductive plate between the semiconductor die and the redistribution layer.

9. The package of claim 1, further comprising a plurality of vias to connect the via bar to the redistribution layer.

10. The package of claim 1, further comprising a passivation layer between the semiconductor die and the conductive plate.

11. A computing device comprising:
a power supply;
an antenna;

a package containing a conductive plate, a semiconductor die having a front side and a back side, the back side being attached to the conductive plate, a radio frequency component attached to the conductive plate and coupled to the antenna, a dielectric filled cavity in the conductive plate adjacent to the radio frequency component, and a redistribution layer attached to the front side of the semiconductor die for external connection to the antenna and the power supply, wherein the semiconductor die is a processor;

a memory die;

a second dielectric filled cavity in the conductive plate spaced apart from the processor and a via bar within the second dielectric filled cavity; and a connection pad array on the via bar to connect to the memory die on a side of the conductive plate opposite the processor and to connect the memory die to the processor through the redistribution layer.

12. A semiconductor package comprising:

a conductive plate;

a semiconductor die having a front side and a back side, the back side being attached to the conductive plate;

a radio frequency component attached to the conductive plate;

a dielectric filled cavity in the conductive plate adjacent to the radio frequency component;

a redistribution layer attached to the front side of the semiconductor die for external connection;

a second die;

a second dielectric filled cavity in the conductive plate spaced apart from the semiconductor die and a via bar within the second dielectric filled cavity; and a connection pad array on the via bar to connect to the second die on a side of the conductive plate opposite the semiconductor die.

13. A computing device comprising:

a power supply;

an antenna; and a package containing a conductive plate, a semiconductor die having a front side and a back side, the back side being attached to the conductive plate, a radio frequency component attached to the conductive plate and coupled to the antenna, a dielectric filled cavity in the conductive plate, the dielectric filled cavity continuously surrounded by the conductive plate, and the dielectric filled cavity vertically beneath the radio frequency component such that the radio frequency component and the dielectric filled cavity overlap with one another in a plan view, wherein the dielectric filled cavity extends through the conductive plate from a side attached to the semiconductor die to a side opposite the semiconductor die, a redistribution layer attached to the front side of the semiconductor die for external connection to the antenna and the power supply, a second die, a second dielectric filled cavity in the conductive plate spaced apart from the semiconductor die and a via bar within the second dielectric filled cavity, and a connection pad array on the via bar to connect to the second die on a side of the conductive plate opposite the semiconductor die.

14. A semiconductor package comprising:

a conductive plate;

a semiconductor die having a front side and a back side, the back side being attached to the conductive plate;

a radio frequency component attached to the conductive plate;

a dielectric filled cavity in the conductive plate, the dielectric filled cavity vertically beneath the radio frequency component such that the radio frequency component and the dielectric filled cavity overlap with one another in a plan view, wherein the dielectric filled cavity extends through the conductive plate from a side attached to the semiconductor die to a side opposite the semiconductor die;

a redistribution layer attached to the front side of the semiconductor die for external connection;

a second die;

a second dielectric filled cavity in the conductive plate spaced apart from the semiconductor die and a via bar within the second dielectric filled cavity; and a connection pad array on the via bar to connect to the second die on a side of the conductive plate opposite the semiconductor die.

15. The package of claim 14, further comprising a plurality of vias to connect the via bar to the redistribution layer.

* * * * *